United States Patent
Zhang et al.

(10) Patent No.: US 11,737,303 B2
(45) Date of Patent: Aug. 22, 2023

(54) ORGANIC LIGHT-EMITTING DIODE DISPLAY SUBSTRATE AND MANUFACTURING METHOD THEREOF, DISPLAY DEVICE

(71) Applicant: BOE Technology Group Co., Ltd., Beijing (CN)

(72) Inventors: Kui Zhang, Beijing (CN); Li Liu, Beijing (CN); Pengcheng Lu, Beijing (CN); Yunlong Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 685 days.

(21) Appl. No.: 16/957,292

(22) PCT Filed: Aug. 27, 2019

(86) PCT No.: PCT/CN2019/102864
§ 371 (c)(1),
(2) Date: Jun. 23, 2020

(87) PCT Pub. No.: WO2021/035537
PCT Pub. Date: Mar. 4, 2021

(65) Prior Publication Data
US 2023/0118463 A1    Apr. 20, 2023

(51) Int. Cl.
*H01L 21/00*        (2006.01)
*H10K 50/813*       (2023.01)
(Continued)

(52) U.S. Cl.
CPC ......... *H10K 50/813* (2023.02); *H10K 50/822* (2023.02); *H10K 59/131* (2023.02);
(Continued)

(58) Field of Classification Search
CPC .................................................. H10K 50/812
See application file for complete search history.

(56) References Cited

U.S. PATENT DOCUMENTS

| | | |
|---|---|---|
| 10,170,534 B1 | 1/2019 | Kim et al. |
| 2006/0158111 A1 | 7/2006 | Hayashi |

(Continued)

FOREIGN PATENT DOCUMENTS

| | | |
|---|---|---|
| CN | 102569675 A | 7/2012 |
| CN | 107799577 A | 3/2018 |

(Continued)

OTHER PUBLICATIONS

Aug. 17, 2022—(EP) Extended European Search Report Appn 19933206.5.

*Primary Examiner* — Douglas M Menz (74) *Attorney, Agent, or Firm* — Banner & Witcoff, Ltd.

(57) ABSTRACT

An organic light-emitting diode (OLED) display substrate, a manufacturing method thereof, and a display device are disclosed. In the OLED display substrate, an anode pattern is located at a side of an insulating layer away from a base substrate and is located in an effective display region; an organic light-emitting layer is located on the anode pattern; a periphery region includes a lead wire region and a virtual region that are at least partly overlapped; a lead wire is located in the lead wire region; the virtual region is provided with a virtual anode pattern, the virtual anode pattern is insulated from the lead wire; the periphery region further includes an annular electrode surrounding the effective display region; a cathode is electrically connected with the annular electrode; the virtual region is located at an outer side of the annular electrode away from the effective display region.

20 Claims, 6 Drawing Sheets

(51) Int. Cl.
  *H10K 59/131* (2023.01)
  *H10K 71/00* (2023.01)
  *H10K 50/822* (2023.01)
  *H10K 59/12* (2023.01)
  *H10K 59/88* (2023.01)

(52) U.S. Cl.
  CPC ......... *H10K 71/00* (2023.02); *H10K 59/1201* (2023.02); *H10K 59/88* (2023.02)

(56) References Cited

U.S. PATENT DOCUMENTS

| | | |
|---|---|---|
| 2013/0342779 A1 | 12/2013 | Jung et al. |
| 2016/0372535 A1 | 12/2016 | Lee et al. |
| 2018/0226460 A1 | 8/2018 | Zhu et al. |
| 2019/0386074 A1 | 12/2019 | Li et al. |

FOREIGN PATENT DOCUMENTS

| | | |
|---|---|---|
| CN | 107978622 A | 5/2018 |
| CN | 109935601 A | 6/2019 |
| EP | 1533848 A2 | 5/2005 |
| EP | 3522229 A1 | 8/2019 |

ORGANIC LIGHT-EMITTING DIODE DISPLAY SUBSTRATE AND MANUFACTURING METHOD THEREOF, DISPLAY DEVICE

This application is a U.S. National Phase Entry of International Application No. PCT/CN2019/102864 filed on Aug. 27, 2019, designating the United States of America. The present application claims priority to and the benefit of the above-identified application and the above-identified application is incorporated by reference herein in its entirety.

TECHNICAL FIELD

Embodiments of the present disclosure relate to an organic light-emitting diode display substrate, a manufacturing method thereof and a display device.

BACKGROUND

With the continuous development of the market of display devices, organic light-emitting diode (OLED) displayer has become one of currently mainstream display devices for its advantages of self-illumination, higher contrast ratio, smaller thickness, wider viewing-angle, quicker response, bendable property, wider temperature range and the like, and hence has become a research hotpot of major manufactures.

An OLED usually includes an anode, a cathode and an organic electroluminescence unit interposed between the anode and the cathode; the organic electroluminescence unit at least includes one hole transportation layer, one light-emitting layer and one electron transportation layer, and the organic electroluminescence unit is capable of emitting light under the drive of the anode and the cathode. Generally, the mainstream manufacturing process for the OLED display device is to evaporate the light-emitting layer by using a fine metal mask (FMM) and to manufacture the anode by using a sputtering process and an etching process.

SUMMARY

Embodiments of the present disclosure provide an organic light-emitting diode (OLED) display substrate, a manufacturing method thereof and a display device. The OLED display substrate includes: a base substrate, including an effective display region and a periphery region surrounding the effective display region; a driver circuit, located in the base substrate; a lead wire, located on the base substrate; an insulating layer, located at a side of the lead wire away from the base substrate; an anode pattern, located at a side of the insulating layer away from the base substrate and located in the effective display region; and an organic light-emitting layer, located at a side of the anode pattern away from the base substrate. The periphery region includes a lead wire region and a virtual region that are at least partly overlapped; the lead wire is configured to connect the driver circuit and the anode pattern; the lead wire is located in the lead wire region; the virtual region is provided with a virtual anode pattern; the virtual anode pattern is arranged to be insulated from the lead wire; the anode pattern includes a plurality of anodes; and the virtual anode pattern includes a plurality of virtual anodes. The periphery region further includes an annular electrode arranged to surround the effective display region; the cathode is electrically connected with the annular electrode; the annular electrode is configured to apply the cathode with a cathode voltage; and the virtual region is located at an outer side of the annular electrode away from the effective display region. It this way, it needs to form a virtual anode pattern in the virtual region of the periphery region at the same time when manufacturing the anode pattern in the effective display region of the OLED display substrate, so that the difference between an amount of a portion of the conductive layer to be removed from the effective display region for forming the anode pattern and an amount of a portion of the conductive layer to be removed from the periphery region for forming the virtual anode pattern is relatively small, which on the one hand is advantageous for controlling the technical film thickness and the dimensional uniformity of the anode pattern and on the other hand can prevent from the occurrence of the over-etching phenomenon in the insulating layer under the anode pattern.

At least one embodiment of the present disclosure provides an OLED display substrate, including: a base substrate, including an effective display region and a periphery region surrounding the effective display region; a driver circuit, located in the base substrate; a lead wire, located on the base substrate; an insulating layer, located at a side of the lead wire away from the base substrate; an anode pattern, located at a side of the insulating layer away from the base substrate and located in the effective display region; and an organic light-emitting layer, located at a side of the anode pattern away from the base substrate. The periphery region includes a lead wire region and a virtual region that are at least partly overlapped; the lead wire is configured to connect the driver circuit and the anode pattern; the lead wire is located in the lead wire region; the virtual region is provided with a virtual anode pattern; the virtual anode pattern is arranged to be insulated from the lead wire; the anode pattern includes a plurality of anodes; and the virtual anode pattern includes a plurality of virtual anodes. The periphery region further includes an annular electrode arranged to surround the effective display region; the cathode is electrically connected with the annular electrode; the annular electrode is configured to apply the cathode with a cathode voltage; and the virtual region is located at an outer side of the annular electrode away from the effective display region.

For example, in the OLED display substrate provided by an embodiment of the present disclosure, in the virtual region, a portion of the insulating layer in which the virtual anode is in direct contact with the lead wire is not provided with a via hole.

For example, the OLED display substrate provided by an embodiment of the present disclosure further includes: a circuit structure, located between the base substrate and the insulating layer; the insulating layer includes a first via hole and a second via hole; the first via hole is located in the effective display region; the anode pattern is electrically connected with the circuit structure through the first via hole; an orthographic projection of the second via hole on the base substrate is within an orthographic projection of the annular electrode on the base substrate; and the annular electrode is electrically connected with the circuit structure through the second via hole.

For example, in the OLED display substrate provided by an embodiment of the present disclosure, a size and a shape of the plurality of anodes in the anode pattern are substantially the same with that of the plurality of virtual anodes in the virtual anode pattern, respectively.

For example, in the OLED display substrate provided by an embodiment of the present disclosure, an arrangement manner of the plurality of anodes in the anode pattern is substantially the same with that of the plurality of virtual anodes in the virtual anode pattern.

For example, in the OLED display substrate provided by an embodiment of the present disclosure, a ratio of an area of the virtual region to an area of the periphery region is greater than 80%.

For example, in the OLED display substrate provided by an embodiment of the present disclosure, the periphery region further includes a bonding region, the virtual region is not overlapped with the bonding region.

For example, in the OLED display substrate provided by an embodiment of the present disclosure, the lead wire region is within a range of the virtual region, a size of each of the plurality of virtual anodes is greater than a line width of the lead wire, and an orthographic projection of the virtual anode on the base substrate covers an orthographic projection of the lead wire on the base substrate.

For example, in the OLED display substrate provided by an embodiment of the present disclosure, the base substrate is a silica-based substrate.

For example, in the OLED display substrate provided by an embodiment of the present disclosure, the insulating layer includes silicon oxide.

At least one embodiment of the present disclosure provides a display device, including the OLED display substrate described in any of the foregoing.

At least one embodiment of the present disclosure provides a manufacturing method of an organic light-emitting diode (OLED) display substrate. The OLED display substrate includes an effective display region and a periphery region surrounding the effective display region, the periphery region includes a lead wire region and a virtual region that are at least partly overlapped. The manufacturing method includes: providing a base substrate, the base substrate being provided with a driver circuit; forming a lead wire on the base substrate, the lead wire being located in the lead wire region; forming an insulating layer at a side of the lead wire away from the base substrate; forming a conductive layer at a side of the insulating layer away from the base substrate; patterning the conductive layer to form an anode pattern in the effective display region, form a virtual anode pattern in the virtual region and form an annular electrode between the virtual region and the effective display region; forming an organic light-emitting layer at a side of the anode pattern away from the base substrate; and forming a cathode at a side of the organic light-emitting layer away from the anode pattern. The lead wire is configured to connect the driver circuit and the anode pattern; the virtual anode pattern is arranged to be insulated from the lead wire; the anode pattern includes a plurality of anodes; the virtual anode pattern includes a plurality of virtual anodes; the cathode is electrically connected with the annular electrode; and the annular electrode is configured to apply the cathode with a cathode voltage.

For example, in the manufacturing method of the OLED display substrate provided by an embodiment of the present disclosure, in the virtual region, a portion of the insulating layer in which the virtual anode is in direct contact with the lead wire is not provided with a via hole.

For example, the manufacturing method of the OLED display substrate provided by an embodiment of the present disclosure further includes: forming a circuit structure between the base substrate and the insulating layer; and forming a first via hole and a second via hole in the insulating layer, the first via hole being located in the effective display region, the anode pattern being electrically connected with the circuit structure through the first via hole, an orthographic projection of the second via hole on the base substrate being within an orthographic projection of the annular electrode on the base substrate; and the annular electrode being electrically connected with the circuit structure through the second via hole.

For example, in the manufacturing method of the OLED display substrate provided by an embodiment of the present disclosure, patterning the conductive layer to form an anode pattern in the effective display region, form a virtual anode pattern in the virtual region and form an annular electrode between the virtual region and the effective display region includes: forming a photoresist pattern at a side of the conductive layer away from the base substrate; and performing an etching process to the conductive layer by using the photoresist pattern as a mask to form the anode pattern, the virtual anode pattern and the annular electrode.

For example, in the manufacturing method of the OLED display substrate provided by an embodiment of the present disclosure, a size and a shape of the plurality of anodes in the anode pattern are substantially the same with that of the plurality of virtual anodes in the virtual anode pattern, respectively.

For example, in the manufacturing method of the OLED display substrate provided by an embodiment of the present disclosure, an arrangement manner of the plurality of anodes in the anode pattern is substantially the same with that of the plurality of virtual anodes in the virtual anode pattern.

For example, in the manufacturing method of the OLED display substrate provided by an embodiment of the present disclosure, the base substrate is a silicon-based substrate.

For example, in the manufacturing method of the OLED display substrate provided by an embodiment of the present disclosure, the periphery region further includes a bonding region, the virtual region is not overlapped with the bonding region.

BRIEF DESCRIPTION OF THE DRAWINGS

In order to clearly illustrate the technical solutions of the embodiments of the disclosure, the drawings of the embodiments will be briefly described in the following; it is obvious that the described drawings below are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the manufacturing process of the OLED display substrate, the manufacturing process for the anode usually includes: forming a conductive layer (e.g., a tin indium oxide layer) on a substrate by using a sputtering process; forming a photoresist pattern at a side of the conductive layer away from the substrate; performing an etching process to the conductive layer by using the photoresist pattern as a mask to form an anode pattern; and removing the photoresist pattern. During the research, inventors of the present application has found that, when etching the conductive layer, an anode pattern needs to be formed in an effective display region of the OLED display substrate but a portion of the conductive layer in a periphery region of the OLED display substrate needs to be completely removed, resulting in that a difference between an amount of a portion of the conductive layer to be removed from the effective display region and an amount of a portion of the conductive layer to be removed from the periphery region, by etching, is relatively great; however, a dry etching process possesses poor selectivity, which on the one hand easily leads to uncontrollable technical film thickness and dimensional uniformity of the finally obtained anode pattern, and on the other hand easily leads to an over-etching phenomenon to be occurred in an insulating layer under the anode pattern.

Figure 1:
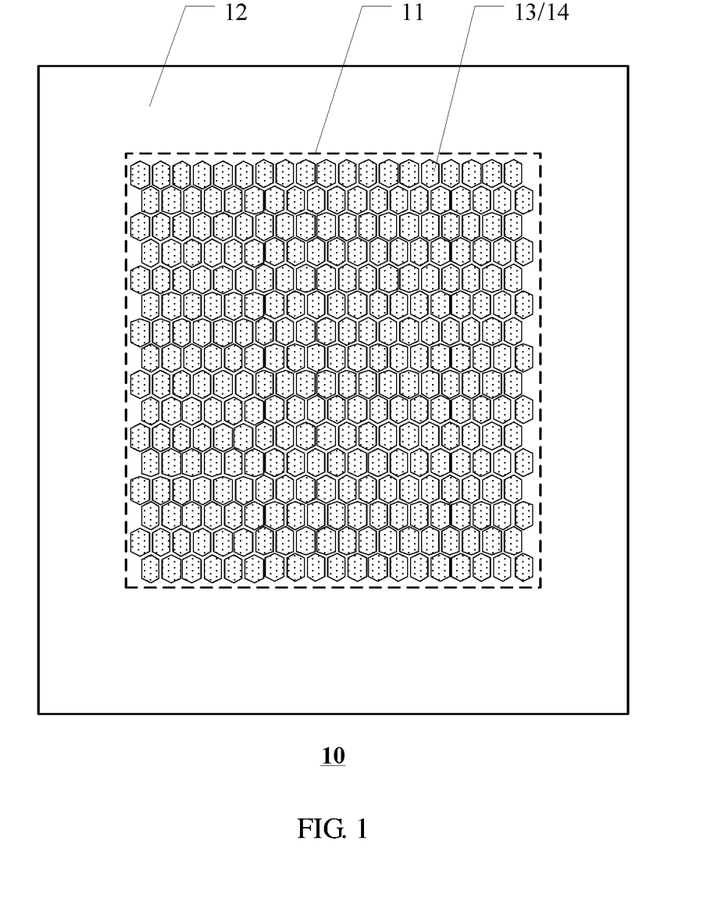
FIG. 1 is a plan view of an OLED display substrate.
Figure 2A:
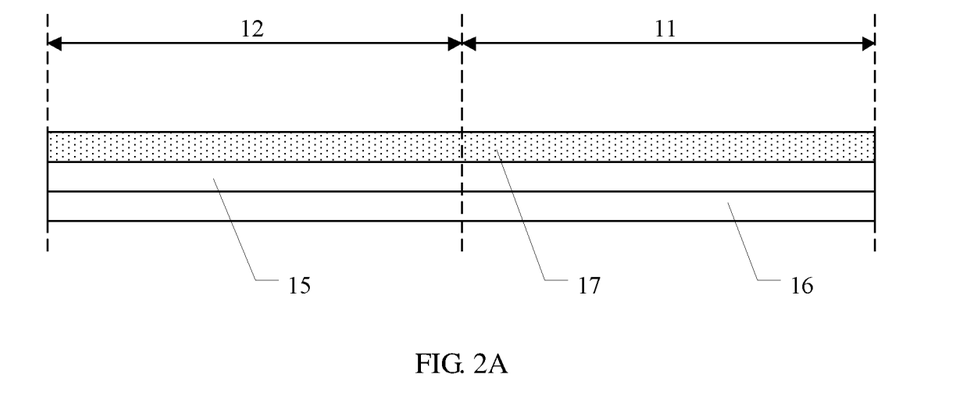
FIGS. 2A-2C are schematic diagrams illustrating a manufacturing method of an anode pattern in an OLED display substrate.
Figure 2B:
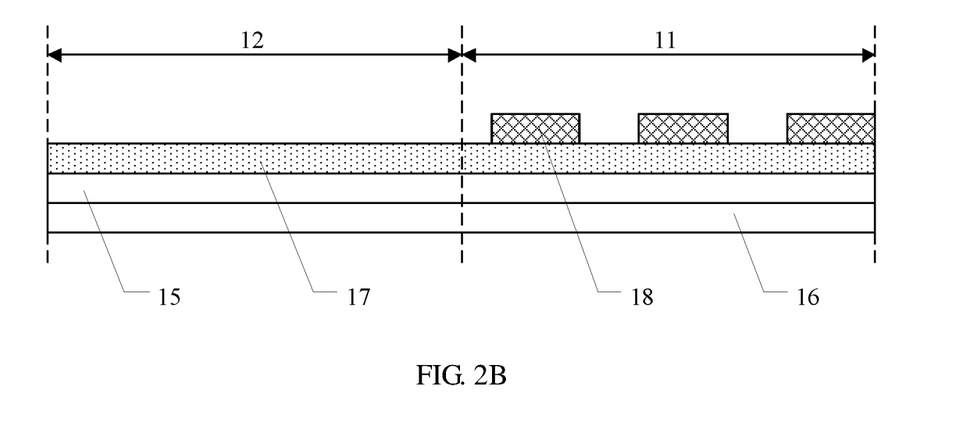
Figure 2C:
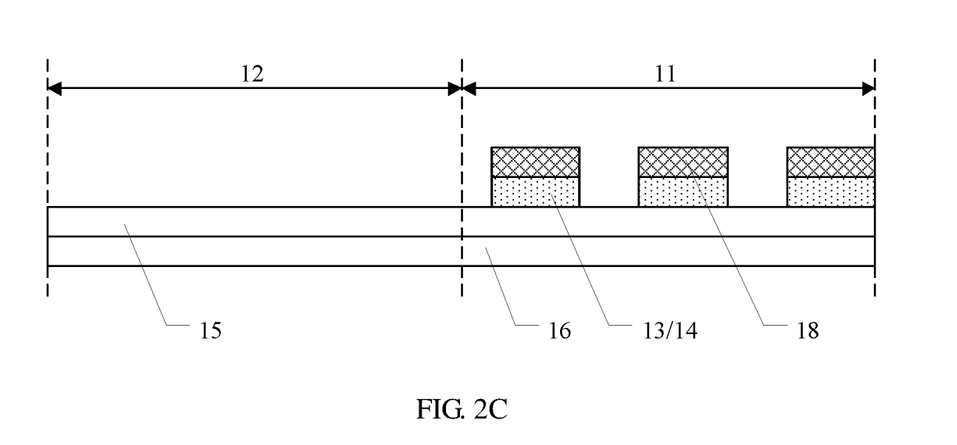

FIG. 1 is a plan view of an OLED display substrate. As illustrated in FIG. 1, the OLED display substrate 10 includes an effective display region 11 and a periphery region 12 surrounding the effective display region 11; the effective display region 11 is provided with an anode pattern 13; the anode pattern 13 includes a plurality of anodes 14 so as to drive a light-emitting layer (not illustrated) in the OLED display substrate 10 to emit light. FIGS. 2A-2C are schematic diagrams illustrating a manufacturing method of an anode pattern in an OLED display substrate. As illustrated in FIG. 2A, a conductive layer 17 is formed at a side of an insulating layer 15 away from a base substrate 16; as illustrated in FIG. 2B, a photoresist pattern 18 is formed at a side of the conductive layer 17 away from the insulating layer 15; as illustrated in FIG. 2C, the conductive layer 17 is etched by using the photoresist pattern 18 as a mask to form an anode pattern 13. As illustrated in FIG. 1 and FIGS. 2A-2C, it needs to form an anode pattern in the effective display region of the OLED display device, but needs to completely remove the conductive layer in the periphery region of the OLED display device, resulting in that, in the same dry etching process, the difference between the amount of the portion of the conductive layer to be removed from the effective display region and the amount of the portion of the conductive layer to be removed from the periphery region is relatively great. When configuring etching parameters (e.g., a concentration, a flow rate and the like of gas for the dry etching process) that are sufficient to etch away the portion of the conductive layer in the periphery region, an over-etching phenomenon may be easily occurred in the portion of the conductive layer in the effective display region, which makes it difficult to control the technical film thickness and the dimensional uniformity of the anode pattern as formed; on the other hand, because the dry etching process possesses poor selectivity, the insulating layer under the anode pattern may be likely etched away, resulting in various defections.

An embodiment of the present disclosure provides an organic light-emitting diode (OLED) display substrate, a manufacturing method thereof and a display device. The OLED display substrate includes a base substrate, a lead wire, an insulating layer, an anode pattern, an organic light-emitting layer and a cathode; the base substrate includes an effective display region and a periphery region surrounding the effective display region; the lead wire is located on the base substrate; the insulating layer is located at a side of the lead wire away from the base substrate; the anode pattern is located at a side of the insulating layer away from the base substrate and is located in the effective display region; the organic light-emitting layer is located at a side of the anode pattern away from the base substrate; the periphery region includes a lead wire region and a virtual region that are at least partly overlapped; the lead wire is located in the lead wire region; the virtual region is provided with a virtual anode pattern; the virtual anode pattern is arranged to be insulated from the lead wire; the anode pattern includes a plurality of anodes; the virtual anode pattern includes a plurality of virtual anodes; the periphery region further includes an annular electrode arranged to surround the effective display region; the cathode is electrically connected with the annular electrode; the annular electrode is configured to apply the cathode with a cathode voltage; and the virtual region is located at an outer side of the annular electrode away from the effective display region. In this way, it needs to form a virtual anode pattern in the virtual region of the periphery region at the same time when manufacturing the anode pattern in the effective display region of the OLED display substrate, so that the difference between an amount of a portion of the conductive layer to be removed from the effective display region for forming the anode pattern and an amount of a portion of the conductive layer to be removed from the periphery region for forming the virtual anode pattern is relatively small, which on the one hand is advantageous for controlling the technical film thickness and the dimensional uniformity of the anode pattern and on the other hand can prevent from the occurrence of the over-etching phenomenon in the insulating layer under the anode pattern.

Hereinafter, an OLED display substrate, a manufacturing method thereof and a display device provided by embodiments of the present disclosure will be described in more details in conjunction with the drawings.

Figure 3:
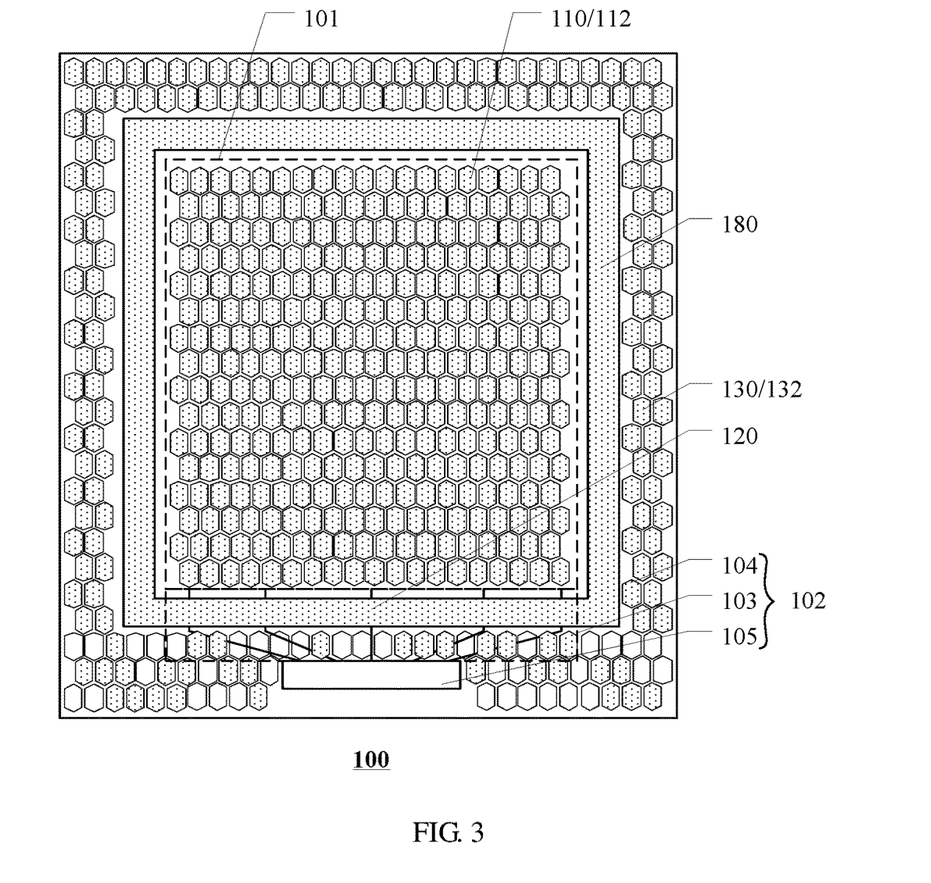
FIG. 3 is a plan view of an OLED display substrate provided by an embodiment of the present disclosure.
Figure 4:
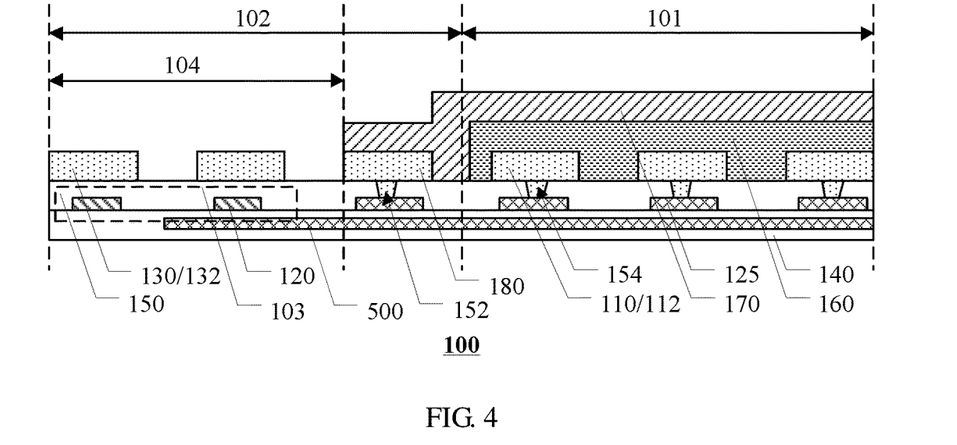
FIG. 4 is a structural diagram of an OLED display substrate provided by an embodiment of the present disclosure.

FIG. 3 is a plan view of an OLED display substrate provided by an embodiment of the present disclosure. FIG. 4 is a structural diagram of an OLED display substrate provided by an embodiment of the present disclosure. As illustrated in FIG. 3 and FIG. 4, the OLED display substrate 100 includes a base substrate 140, a lead wire 120, an insulating layer 150, an anode pattern 110, an organic light-emitting layer 160 and a cathode 170. The base substrate 140 includes an effective display region 101 and a periphery region 102 surrounding the effective display region 101; that is, the OLED display substrate 100 includes an effective display region 101 and a periphery region 102 surrounding the effective display region 101. The insulating layer 150 is located at a side of the lead wire 120 away from the base substrate 140; the anode pattern 110 is located at a side of the insulating layer 150 away from the base substrate 140 and is located in the effective display region 101; the organic light-emitting layer 160 is located at a side of the anode pattern 110 away from the base substrate 140; the periphery region 102 includes a lead wire region 103 and a virtual region 104 that are at least partly overlapped; the lead wire 120 is located in the lead wire region 103; the virtual region 104 is provided with a virtual anode pattern 130; the virtual anode pattern 130 is arranged to be insulated from the lead wire 120; the anode pattern 110 includes a plurality of anodes 112; the virtual anode pattern 130 includes a plurality of virtual anodes 132; the periphery region 102 further includes an annular electrode 180 arranged to surround the effective display region 101; the cathode 170 is electrically connected with the annular electrode 180; the annular electrode 180 is configured to apply the cathode 170 with a cathode voltage; the virtual region 104 is located at an outer side of the annular electrode 180 away from the effective display region 101, that is to say, the annular electrode 180 is disposed between the effective display region 101 and the virtual region 104. It should be explained that, the above-described virtual region refers to a region provided with the virtual anode pattern, and the above-described lead wire region refers to a region provided with the lead wire. When the lead wire region and the virtual region are at least partly overlapped, the virtual anode pattern and the lead wire are also at least partly overlapped.

In the OLED display substrate provided by the present embodiment, it needs to form a virtual anode pattern in the virtual region of the periphery region at the same time when manufacturing the anode pattern in the effective display region of the OLED display substrate, so that the difference between an amount of a portion of the conductive layer to be removed from the effective display region for forming the anode pattern and an amount of a portion of the conductive layer to be removed from the periphery region for forming the virtual anode pattern is relatively small, which on the one hand is advantageous for controlling the technical film thickness and the dimensional uniformity of the anode pattern and on the other hand can prevent from the occurrence of the over-etching phenomenon in the insulating layer under the anode pattern. From another aspect, because the technical film thickness and the dimensional uniformity of the anode pattern in the OLED display substrate can be more easily controlled, a deviation of the technical film thickness of each of the anodes in the anode pattern of the OLED display substrate from a designed value can be further decreased, and the dimensional uniformity of the anode can be improved, thereby achieving better display effect, higher stability and longer service life.

In some examples, as illustrated in FIG. 4, the display substrate 100 further includes a driver circuit 500 located in the base substrate 140, and the lead wire 120 is configured to connect the driver circuit 500 and the anode pattern 110. That is to say, the base substrate provided by the present embodiment is integrated with a driver circuit (e.g., gate driver circuit or source driver circuit), for example, the base substrate may be a silicon-based substrate integrated with a driver circuit.

For example, the anode pattern 110 and the virtual anode pattern 130 may be formed by patterning a same conductive layer (e.g., ITO layer), and an insulating layer may be provided between the lead wire 120 and the virtual anode pattern 130 so that the lead wire 120 and the virtual anode pattern 30 are insulated from each other.

In some examples, the anode pattern 110, the virtual anode pattern 130 and the annular electrode 180 are arranged in a same layer, and may be formed by patterning a same conductive layer (e.g., ITO layer).

In some examples, as illustrated in FIG. 3, the size and shape of the plurality of anodes 112 in the anode pattern 110 are substantially the same with that of the plurality of virtual anodes 132 in the virtual anode pattern 130, respectively. That is to say, the size of the anode 112 is substantially the same with that of the virtual anode 132, and the shape of the anode 112 is substantially the same with that of the virtual anode 132. In this way, when manufacturing the anode pattern of the OLED display substrate, the difference between the amount of the portion of the conductive layer to be removed from the effective display region for forming the anode pattern and the amount of the portion of the conductive layer to be removed from the periphery region for forming the virtual anode pattern can be further reduced, which is more advantageous for controlling the technical film thickness and the dimensional uniformity of the anode pattern and can further prevent from the occurrence of the over-etching phenomenon in the insulating layer under the anode pattern. It should be explained that, the above-mentioned "substantially the same" includes the case of "exactly the same", and also includes the case where a difference ratio of the size of the anode to the size of the virtual anode is smaller than 10% and the case where the shape of the anode is similar with the shape of the virtual anode.

For example, the shape of the anode 112 and the virtual anode 132 may be rectangle, hexagon, ellipse or the like.

In some examples, as illustrated in FIG. 4, the OLED display substrate 100 further includes a circuit structure 125 located between the base substrate 140 and the insulating layer 150; the insulating layer 150 includes a first via hole 152 and a second via hole 154; the first via hole 152 is located in the effective display region 101; the anode pattern 110 is electrically connected with the circuit structure 125 through the first via hole 152; an orthographic projection of the second via hole 154 on the base substrate 140 is within an orthographic projection of the annular electrode 180 on the base substrate 140; the annular electrode 180 is electrically connected with the circuit structure 125 through the second via hole 154. In some examples, as illustrated in FIG. 3, an arrangement manner of the plurality of anodes 112 in the anode pattern 110 is substantially the same with that of the plurality of virtual anodes 132 in the virtual anode pattern 130. It should be explained that, the above-mentioned arrangement manner includes a spaced distance or a positional relationship between anodes or virtual anodes. In this way, when manufacturing the anode pattern of the OLED display substrate, the difference between the amount of the portion of the conductive layer to be removed from the effective display region for forming the anode pattern and the amount of the portion of the conductive layer to be removed from the periphery region for forming the virtual anode pattern can be further reduced, which is more advantageous for controlling the technical film thickness and the dimensional uniformity of the anode pattern and can further prevent from the occurrence of the over-etching phenomenon in the insulating layer under the anode pattern. It should be explained that, the above-mentioned "substantially the same" includes the case of "exactly the same", and also includes the case where a difference ratio of a spaced distance between anodes to a spaced distance between virtual anodes is smaller than 10% and the case where the positional relationship between the plurality of anodes is similar with the positional relationship between the plurality of virtual anode.

In some examples, as illustrated in FIG. 3, a ratio of an area of the virtual region 104 to an area of the periphery region 102 is greater than 80%, so as to ensure that the difference between the amount of the portion of the conductive layer to be removed from the effective display region for forming the anode pattern and the amount of the portion of the conductive layer to be removed from the periphery region for forming the virtual anode pattern can be relatively small.

In some examples, as illustrated in FIG. 3, the periphery region 102 further includes a bonding region 105, and the virtual region 104 is not overlapped with the bonding region 105. That is to say, the bonding region 105 is not provided with the virtual anode pattern. For example, because the base substrate of the present embodiment is integrated with a driver circuit, the bonding region may be configured to be connected with a power source.

In some examples, as illustrated in FIG. 3, in the virtual region 104, a portion of the insulating layer 150 in which the virtual anode 132 is in direct contact with the lead wire 120 is not provided with a via hole.

For example, the OLED display substrate may further include functional layers such as a hole injection layer, a hole transportation layer, an electron injection layer and an electron transportation layer. The hole injection layer is located between the anode pattern and the organic light-emitting layer; the hole transportation layer is located between the hole injection layer and the organic light-emitting layer; the electron injection layer is located between the cathode and the organic light-emitting layer; the electron transportation layer is located between the electron injection layer and the organic light-emitting layer.

For example, the annular electrode 180, the anode pattern 110 and the virtual anode pattern 130 are arranged in a same layer, and located on the insulating layer 150; the annular electrode 180, the anode pattern 110 and the virtual anode pattern 130 may be formed by patterning a same conductive layer.

For example, the virtual region 104 and the annular electrode 180 are arranged to be spaced apart; and a distance from the virtual region 104 to the annular electrode 180 is in the range from 400 µm to 600 µm.

In some examples, as illustrated in FIG. 3 and FIG. 4, the lead wire region 103 is within the range of the virtual region 104, the size of the virtual anode 132 is greater than the line width of the lead wire 120, and the orthographic projection of the virtual anode 132 on the base substrate 140 covers the orthographic projection of the lead wire 120 on the base substrate 140; in this way, when etching the portion of the conductive layer for forming the virtual anode pattern 130, the virtual anode 132 can further protect the lead wire 120 under the insulating layer 150. In such case, even when an over-etching phenomenon is occurred in the insulating layer 150 under the virtual anode pattern 130, the lead wire 120 would not be etched away or exposed.

In some examples, the base substrate 140 is a silicon-based substrate. Of course, the embodiments of the present disclosure include such case but are not limited thereto, and the base substrate 140 may be a substrate of other types.

In some examples, the insulating layer 150 includes silicon oxide. Of course, the embodiments of the present disclosure include such case but are not limited thereto, and the insulating layer 150 may be manufactured by adopting other materials.

Figure 5:
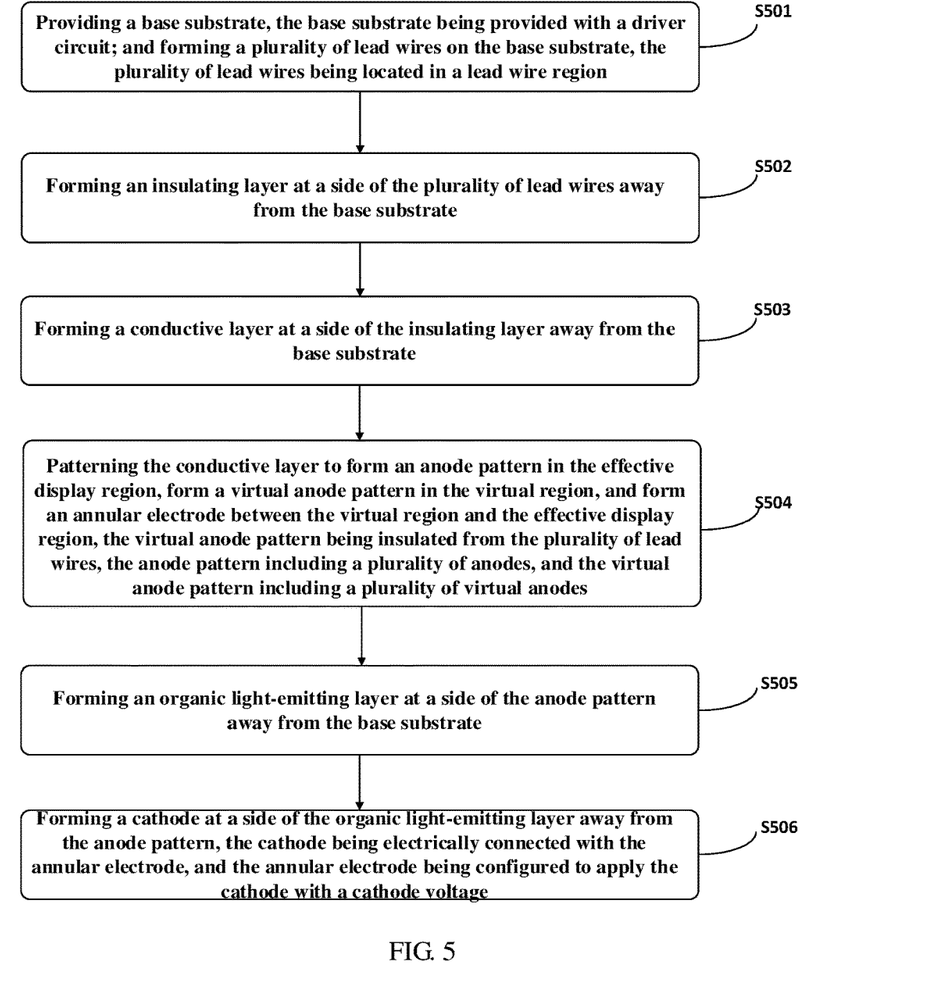
FIG. 5 is a schematic diagram illustrating a manufacturing method of an OLED display substrate provided by an embodiment of the present disclosure.

FIG. 5 is a schematic diagram illustrating a manufacturing method of an OLED display substrate provided by an embodiment of the present disclosure. FIGS. 6A-6F are schematic diagrams illustrating a manufacturing method of an OLED display substrate provided by an embodiment of the present disclosure. The OLED display substrate includes an effective display region and a periphery region surrounding the effective display region; the periphery region includes a lead wire region and a virtual region that are at least partly overlapped. As illustrated in FIG. 5, the manufacturing method of the OLED display substrate includes the following steps S501-S506.

Step S501, providing a base substrate, the base substrate being provided with a driver circuit; and forming a lead wire on the base substrate, the lead wire being located in a lead wire region.

Figure 6A:
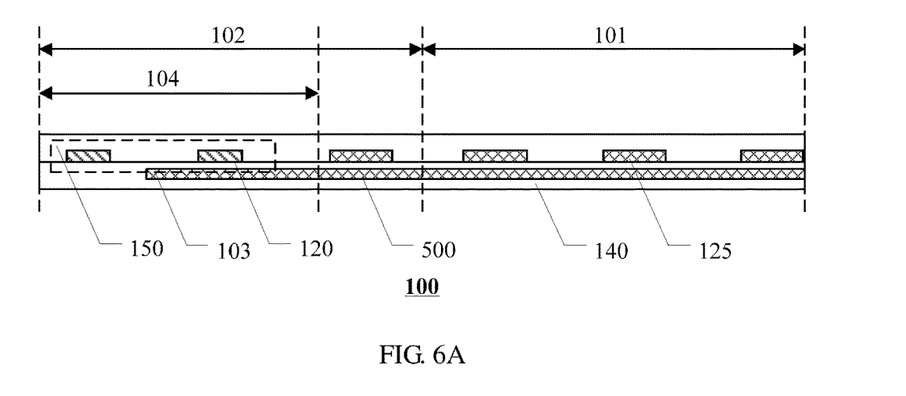
FIGS. 6A-6F are schematic diagrams illustrating a manufacturing method of an OLED display substrate provided by an embodiment of the present disclosure.

For example, as illustrated in FIG. 6A, a lead wire 120 is formed on a lead wire region 103 of a base substrate 140.

In some examples, the base substrate 140 is a silicon-based substrate. Of course, the embodiments of the present disclosure include such case but are not limited thereto, and the base substrate 140 may be a substrate of other types.

Step S502, forming an insulating layer at a side of the lead wire away from the base substrate.

For example, as illustrated in FIG. 6A, an insulating layer 150 is formed at a side of the lead wire 120 away from the base substrate 140.

Step S503, forming a conductive layer at a side of the insulating layer away from the base substrate.

Figure 6B:
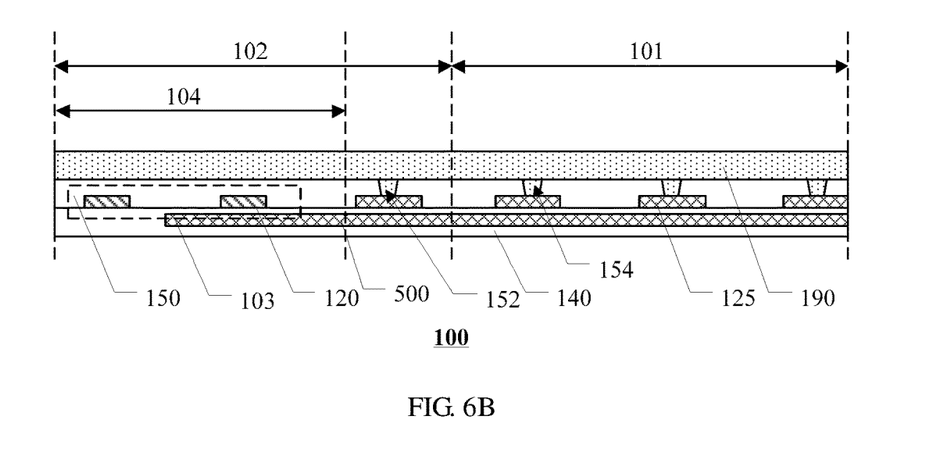

For example, as illustrated in FIG. 6B, a conductive layer 190 is formed at a side of the lead wire 120 away from the base substrate 140. For example, the conductive layer 190 may be formed at a side of the lead wire 120 away from the base substrate 140 by using a sputtering process. Of course, the embodiments of the present disclosure include such case but are not limited thereto, and the conductive layer may also be formed at the side of the lead wire away from the base substrate by using other manufacturing processes.

For example, a material of the conductive layer may be transparent oxide such as ITO. Of course, the embodiments of the present disclosure include such case but are not limited thereto, and the conductive layer may also be manufactured by adopting other materials.

Step S504, patterning the conductive layer to form an anode pattern in the effective display region, form a virtual anode pattern in the virtual region, and form an annular electrode between the virtual region and the effective display region, the virtual anode pattern being insulated from the lead wire, the anode pattern including a plurality of anodes, and the virtual anode pattern including a plurality of virtual anodes.

Figure 6C:
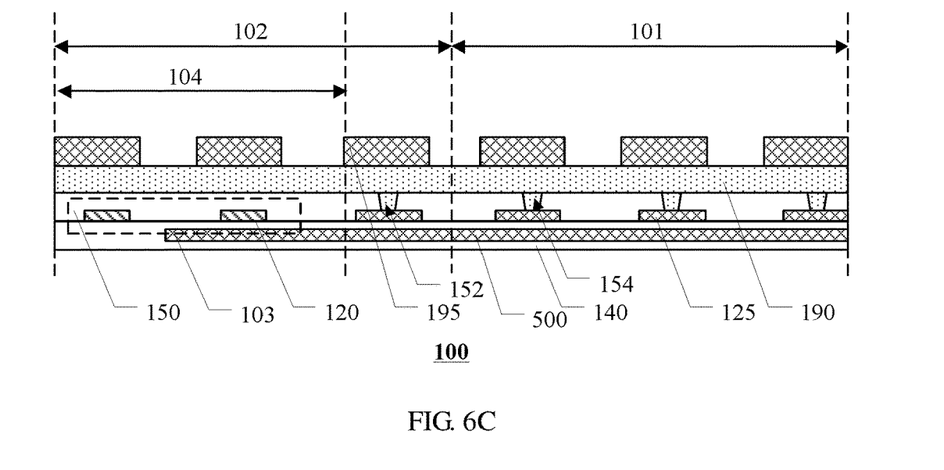
Figure 6D:
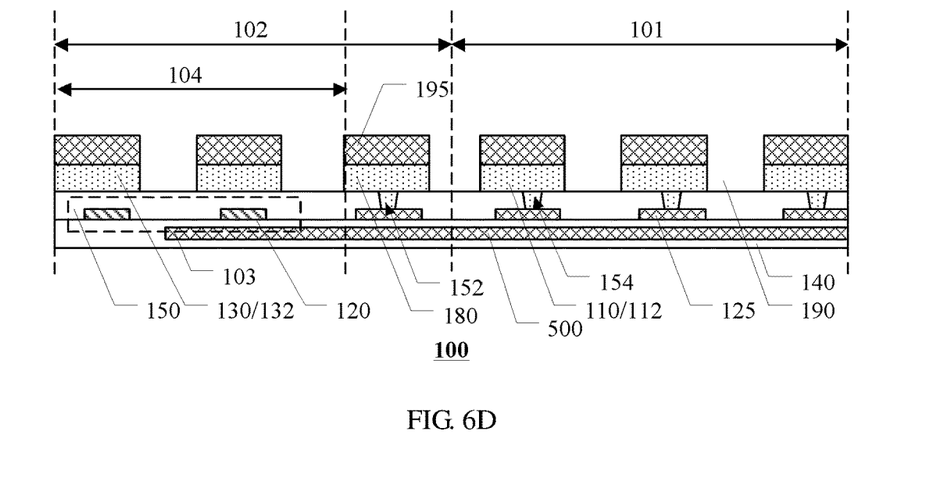
Figure 6E:
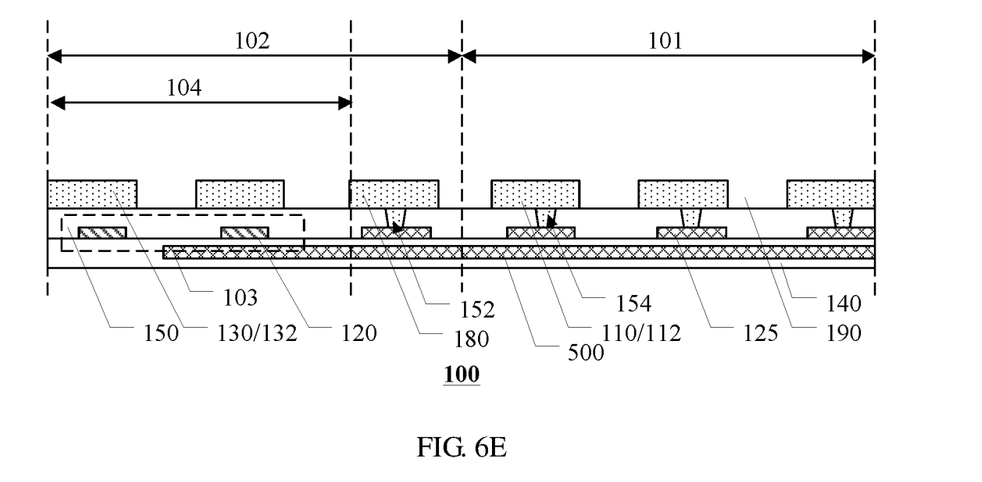

For example, as illustrated in FIGS. 6C-6E, the conductive layer 190 is patterned to form an anode pattern 110, a virtual anode pattern 130 and an annular electrode 180.

Step S505, forming an organic light-emitting layer at a side of the anode pattern away from the base substrate.

Figure 6F:
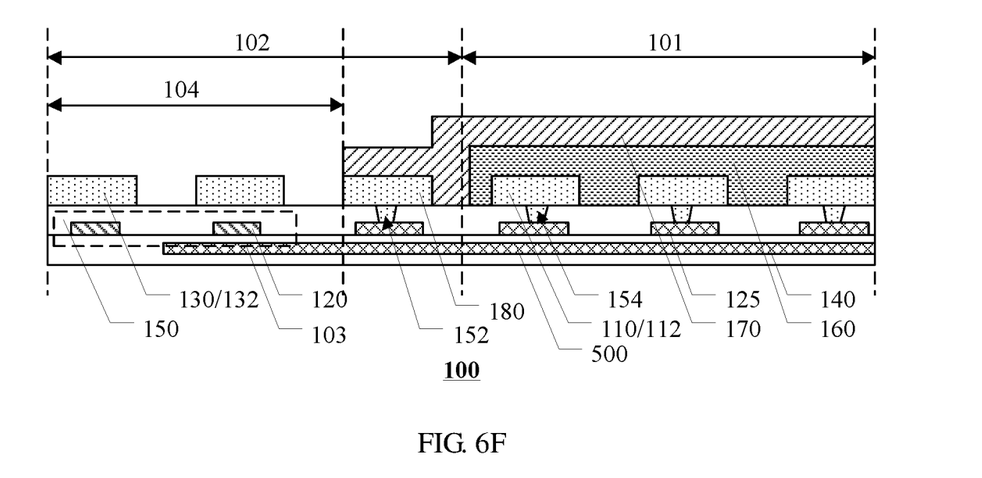

In some examples, as illustrated in FIG. 6F, the manufacturing method further includes: forming an organic light-emitting layer 160 at a side of the anode pattern 110 away from the base substrate 140; and forming a cathode 170 at a side of the organic light-emitting layer 160 away from the anode pattern 110. The organic light-emitting layer 160 may emit light and perform display under the drive of the anode pattern 110 and the cathode 170.

For example, the manufacturing method may further include steps of forming functional layers such as a hole injection layer, a hole transportation layer, an electron injection layer and an electron transportation layer, without repeatedly described in the embodiments of the present disclosure.

Step S506, forming a cathode at a side of the organic light-emitting layer away from the anode pattern, the cathode being electrically connected with the annular electrode, and the annular electrode being configured to apply the cathode with a cathode voltage.

In the manufacturing method of the OLED display substrate provided by the present embodiment, the lead wire is configured to connect the driver circuit and the anode pattern. In the step of patterning the conductive layer to form the anode pattern and the virtual anode pattern, it needs to form the virtual anode pattern in the virtual region of the periphery region at the same time when forming the anode pattern in the effective display region, so that the difference between the amount of the portion of the conductive layer to be removed from the effective display region for forming the anode pattern and the amount of the portion of the conductive layer to be removed from the periphery region for forming the virtual anode pattern is relatively small, which on the one hand is advantageous for controlling the technical film thickness and the dimensional uniformity of the anode pattern and on the other hand can prevent from the occurrence of the over-etching phenomenon in the insulating layer under the anode pattern.

In some examples, as illustrated in FIG. 6C, patterning the conductive layer to form the anode pattern in the effective display region, form the virtual anode pattern in the virtual region and form the annular electrode between the virtual region and the effective display region includes: forming a photoresist pattern 195 at a side of the conductive layer 190 away from the base substrate 140. For example, the photoresist pattern may be formed at the side of the conductive layer away from the base substrate by steps of coating a photoresist, exposing, developing and the like.

In some examples, as illustrated in FIG. 6D, patterning the conductive layer to form the anode pattern in the effective display region, form the virtual anode pattern in the virtual region and form the annular electrode between the virtual region and the effective display region further includes: performing an etching process to the conductive layer 190 by using the photoresist pattern 195 as a mask to form the anode pattern 110 and the virtual anode pattern 130. For example, the conductive layer is patterned by using a dry etching process.

In some examples, as illustrated in FIG. 6D, patterning the conductive layer to form the anode pattern in the effective display region, form the virtual anode pattern in the virtual region and form the annular electrode between the virtual region and the effective display region further includes: removing the photoresist pattern 195 by using an ashing process.

In some examples, the size and the shape of the plurality of anodes in the anode pattern are substantially the same with that of the plurality of virtual anodes in the virtual anode pattern, respectively. That is to say, the size of the anode is substantially the same with that of the virtual anode, and the shape of the anode is substantially the same with that of the virtual anode. In this way, in the step of patterning the conductive layer to form the anode pattern and the virtual anode pattern, when forming the anode pattern in the effective display region, the difference between the amount of the portion of the conductive layer to be removed from the effective display region for forming the anode pattern and the amount of the portion of the conductive layer to be removed from the periphery region for forming the virtual anode pattern can be further reduced, which is more advantageous for controlling the technical film thickness and the dimensional uniformity of the anode pattern and can further prevent from the occurrence of the over-etching phenomenon in the insulating layer under the anode pattern.

In some examples, an arrangement manner of the plurality of anodes in the anode pattern is substantially the same with that of the plurality of virtual anodes in the virtual anode pattern. It should be explained that, the above-mentioned arrangement manner includes a spaced distance or a positional relationship between anodes or virtual anodes. In this way, in the step of patterning the conductive layer to form the anode pattern and the virtual anode pattern, when forming the anode pattern in the effective display region, the difference between the amount of the portion of the conductive layer to be removed from the effective display region for forming the anode pattern and the amount of the portion of the conductive layer to be removed from the periphery region for forming the virtual anode pattern can be further reduced, which is more advantageous for controlling the technical film thickness and the dimensional uniformity of the anode pattern and can further prevent from the occurrence of the over-etching phenomenon in the insulating layer under the anode pattern.

In some examples, the periphery region further includes a bonding region, and the virtual region has no overlap with the bonding region. That is to say, the bonding region is not provided with the virtual anode pattern. More details may be referred to the related description of the embodiment illustrated in FIG. 3 and FIG. 4, without repeatedly explained here.

For example, the lead wire of the lead wire region may extend from the effective display region to the bonding region, and is bonded with an external circuit in the bonding region. More details may be referred to the related description of the embodiment illustrated in FIG. 3, without repeatedly explained here.

In some examples, as illustrated in FIG. 6B, an insulating layer 150 may be formed at a side of the lead wire 120 away from the base substrate 140 so as to achieve the insulation between the conductive layer 190 and the lead wire 120. That is to say, the insulating layer 150 is formed between the lead wire 120 and the conductive layer 190.

In some examples, as illustrated in FIG. 6B, in the virtual region 104, a portion of the insulating layer 150 in which the virtual anode 132 is in direct contact with the lead wire 120 is not provided with a via hole.

For example, a material of the insulating layer 150 may be silicon oxide. Of course, the embodiments of the present disclosure include such case but are not limited thereto, and the insulating layer 150 may also be manufactured by adopting other materials.

For example, the annular electrode 180, the anode pattern 110 and the virtual anode pattern 130 are arranged in a same layer, and located on the insulating layer 150; the annular electrode 180, the anode pattern 110 and the virtual anode pattern 130 may be formed by patterning a same conductive layer.

For example, the virtual region 104 and the annular electrode 180 may be arranged to be spaced apart from each other, and a distance from the virtual region 104 to the annular electrode 180 may be in the range from 400 μm to 600 μm.

In some examples, as illustrated in FIG. 6F, the lead wire region 103 is within the range of the virtual region 104; the size of the virtual anode 132 is greater than the line width of the lead wire 120; an orthographic projection of the virtual anode 132 on the base substrate 140 covers an orthographic projection of the lead wire 120 on the base substrate 140; in this way, when etching the conductive layer for forming the virtual anode pattern 130, the virtual anode 132 may also protect the lead wire 120 under the insulating layer 150. In such case, even when an over-etching phenomenon is occurred in the insulating layer 150 under the virtual anode pattern 130, the lead wire 120 would not be etched away or exposed.

In some examples, the periphery region further includes a bonding region, and the virtual region has no overlap with the bonding region; that is to say, the bonding region is not provided with the virtual anode pattern, and more details may be referred to the related description of FIG. 3.

For example, the lead wire of the lead wire region may extend from the effective display region to the bonding region, and may be bonded with an external circuit in the bonding region. More details may be referred to the related description of FIG. 3.

In some examples, as illustrated in FIG. 6A and FIG. 6B, the manufacturing method further includes: forming a circuit structure 125 between the base substrate 140 and the insulating layer 150; and forming a first via hole 152 and a second via hole 154 in the insulating layer 150. The first via hole 152 is located in the effective display region 101. As illustrated in FIG. 6F, the anode pattern 110 is electrically connected with the circuit structure 125 through the first via hole 152, an orthographic projection of the second via hole 154 on the base substrate 140 is within an orthographic projection of the annular electrode 180 on the base substrate 140, and the annular electrode 180 is electrically connected with the circuit structure 125 through the second via hole 154.

An embodiment of the present disclosure further provides a display device including the OLED display substrate provided by the foregoing embodiments. In this way, the display device possesses advantageous technical effects as same as or similar with that of the above-described OLED display substrate. More details may be referred to the related description of the embodiment illustrated in FIG. 3, without repeatedly explained here.

In some examples, the display device may be any electronic product with display function, such as mobile phone, notebook computer, tablet computer, navigation device, digital photo frame and the like.

The following statements should be noted:

(1) The drawings accompanying the embodiments of the present disclosure involve only the structure(s) in connection with the embodiment(s) of the present disclosure, and other structure(s) can be referred to common design(s).

(2) In case of no conflict, the features in the same embodiment or in different embodiments can be combined with each other.

What have been described above are only specific implementations of the present disclosure, the protection scope of the present disclosure is not limited thereto. The protection scope of the present disclosure should be based on the protection scope of the claims.

What is claimed is:

1. An organic light-emitting diode (OLED) display substrate, comprising:
    a base substrate, comprising an effective display region and a periphery region surrounding the effective display region;
    a driver circuit, located in the base substrate;
    a lead wire, located on the base substrate;
    an insulating layer, located at a side of the lead wire away from the base substrate;
    an anode pattern, located at a side of the insulating layer away from the base substrate and located in the effective display region;
    an organic light-emitting layer, located at a side of the anode pattern away from the base substrate; and
    a cathode, located at a side of the organic light-emitting layer away from the anode pattern, wherein
    the periphery region comprises a lead wire region and a virtual region that are at least partly overlapped; the lead wire is configured to connect the driver circuit and the anode pattern; the lead wire is located in the lead wire region; the virtual region is provided with a virtual anode pattern; the virtual anode pattern is arranged to be insulated from the lead wire; the anode pattern comprises a plurality of anodes; and the virtual anode pattern comprises a plurality of virtual anodes, and
    the periphery region further comprises an annular electrode arranged to surround the effective display region; the cathode is electrically connected with the annular electrode; the annular electrode is configured to apply the cathode with a cathode voltage; and the virtual region is located at an outer side of the annular electrode away from the effective display region.

2. The OLED display substrate according to claim 1, wherein
    in the virtual region, a portion of the insulating layer in which the virtual anode is in direct contact with the lead wire is not provided with a via hole.

3. The OLED display substrate according to claim 1, further comprising:
    a circuit structure, located between the base substrate and the insulating layer, wherein
    the insulating layer comprises a first via hole and a second via hole; the first via hole is located in the effective display region; the anode pattern is electrically connected with the circuit structure through the first via hole; an orthographic projection of the second via hole on the base substrate is within an orthographic projection of the annular electrode on the base substrate; and
    the annular electrode is electrically connected with the circuit structure through the second via hole.

4. The OLED display substrate according to claim 1, wherein a size and a shape of the plurality of anodes in the anode pattern are substantially the same with those of the plurality of virtual anodes in the virtual anode pattern, respectively.

5. The OLED display substrate according to claim 1, wherein an arrangement manner of the plurality of anodes in the anode pattern is substantially the same with that of the plurality of virtual anodes in the virtual anode pattern.

6. The OLED display substrate according to claim 1, wherein a ratio of an area of the virtual region to an area of the periphery region is greater than 80%.

7. The OLED display substrate according to claim 1, wherein the periphery region further comprises a bonding region,
the virtual region is not overlapped with the bonding region.

8. The OLED display substrate according to claim 1, wherein the lead wire region is within a range of the virtual region, and a plurality of lead wires is provided in the lead wire region,
a size of each of the plurality of virtual anodes is greater than a line width of each of the plurality of lead wires, and
an orthographic projection of the virtual anode on the base substrate covers an orthographic projection of the lead wire on the base substrate.

9. The OLED display substrate according to claim 1, wherein the base substrate is a silica-based substrate.

10. The OLED display substrate according to claim 1, wherein the insulating layer comprises silicon oxide.

11. A display device, comprising the OLED display substrate according to claim 1.

12. The display device according to claim 11, wherein the OLED display substrate further comprises:
a circuit structure, located between the base substrate and the insulating layer, wherein
the insulating layer comprises a first via hole and a second via hole; the first via hole is located in the effective display region; the anode pattern is electrically connected with the circuit structure through the first via hole; an orthographic projection of the second via hole on the base substrate is within an orthographic projection of the annular electrode on the base substrate; and
the annular electrode is electrically connected with the circuit structure through the second via hole.

13. A manufacturing method of an organic light-emitting diode (OLED) display substrate, the OLED display substrate comprising an effective display region and a periphery region surrounding the effective display region, the periphery region comprising a lead wire region and a virtual region that are at least partly overlapped,
the manufacturing method comprising:
providing a base substrate, the base substrate being provided with a driver circuit;
forming a lead wire on the base substrate, the lead wire being located in the lead wire region;
forming an insulating layer at a side of the lead wire away from the base substrate;
forming a conductive layer at a side of the insulating layer away from the base substrate;
patterning the conductive layer to form an anode pattern in the effective display region, form a virtual anode pattern in the virtual region and form an annular electrode between the virtual region and the effective display region;
forming an organic light-emitting layer at a side of the anode pattern away from the base substrate; and
forming a cathode at a side of the organic light-emitting layer away from the anode pattern, wherein
the lead wire is configured to connect the driver circuit and the anode pattern; the virtual anode pattern is arranged to be insulated from the lead wire; the anode pattern comprises a plurality of anodes; the virtual anode pattern comprises a plurality of virtual anodes; the cathode is electrically connected with the annular electrode; and the annular electrode is configured to apply the cathode with a cathode voltage.

14. The manufacturing method of the OLED display substrate according to claim 13, wherein in the virtual region, a portion of the insulating layer in which the virtual anode is in direct contact with the lead wire is not provided with a via hole.

15. The manufacturing method of the OLED display substrate according to claim 13, further comprising:
forming a circuit structure between the base substrate and the insulating layer; and
forming a first via hole and a second via hole in the insulating layer, the first via hole being located in the effective display region, the anode pattern being electrically connected with the circuit structure through the first via hole, an orthographic projection of the second via hole on the base substrate being within an orthographic projection of the annular electrode on the base substrate; and the annular electrode being electrically connected with the circuit structure through the second via hole.

16. The manufacturing method of the OLED display substrate according to claim 13, wherein patterning the conductive layer to form an anode pattern in the effective display region, form a virtual anode pattern in the virtual region and form an annular electrode between the virtual region and the effective display region comprises:
forming a photoresist pattern at a side of the conductive layer away from the base substrate; and
performing an etching process to the conductive layer by using the photoresist pattern as a mask to form the anode pattern, the virtual anode pattern and the annular electrode.

17. The manufacturing method of the OLED display substrate according to claim 13, wherein a size and a shape of the plurality of anodes in the anode pattern are substantially the same with those of the plurality of virtual anodes in the virtual anode pattern, respectively.

18. The manufacturing method of the OLED display substrate according to claim 17, wherein an arrangement manner of the plurality of anodes in the anode pattern is substantially the same with that of the plurality of virtual anodes in the virtual anode pattern.

19. The manufacturing method of the OLED display substrate according to claim 13, wherein the base substrate is a silicon-based substrate.

20. The manufacturing method of the OLED display substrate according to claim 13, wherein the periphery region further comprises a bonding region,
the virtual region is not overlapped with the bonding region.

* * * * *